(12) United States Patent
Suh

(10) Patent No.: US 9,649,730 B2
(45) Date of Patent: May 16, 2017

(54) PASTE AND PROCESS FOR FORMING A SOLDERABLE POLYIMIDE-BASED POLYMER THICK FILM CONDUCTOR

(71) Applicant: E I DU PONT DE NEMOURS AND COMPANY, Wilmington, DE (US)

(72) Inventor: Seigi Suh, Cary, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 118 days.

(21) Appl. No.: 14/824,202

(22) Filed: Aug. 12, 2015

(65) Prior Publication Data

US 2017/0043435 A1   Feb. 16, 2017

(51) Int. Cl.

| H01B 1/22 | (2006.01) |
| C09D 5/24 | (2006.01) |
| B23K 35/30 | (2006.01) |
| H05K 1/09 | (2006.01) |
| B23K 35/02 | (2006.01) |
| B23K 35/36 | (2006.01) |

(52) U.S. Cl.
CPC ........ *B23K 35/3006* (2013.01); *B23K 35/025* (2013.01); *B23K 35/3612* (2013.01); *B23K 35/3613* (2013.01); *C09D 5/24* (2013.01); *H01B 1/22* (2013.01); *H05K 1/095* (2013.01)

(58) Field of Classification Search
CPC ... H01B 1/00; H01B 1/16; H01B 1/22; C09D 5/24
See application file for complete search history.

(56) References Cited

U.S. PATENT DOCUMENTS

| 7,169,330 B2 | 1/2007 | Ogiwara |
| 7,348,373 B2 | 3/2008 | Dueber et al. |
| 7,745,516 B2 | 6/2010 | Dueber et al. |
| 8,270,145 B2 | 9/2012 | Dueber et al. |

FOREIGN PATENT DOCUMENTS

CN   104650653 A  *  5/2015

* cited by examiner

*Primary Examiner* — Mark Kopec

(57) ABSTRACT

The invention is directed to a paste composition and a process for forming a solderable polyimide-based polymer thick film conductor. The paste composition comprising an electrically conductive metal, a polyimide, an organosilicon compound and an organic solvent and can be cured by heating at a temperature of 320 to 380° C. The invention also provides an electrical device containing a solderable polyimide-based polymer thick film conductor formed using the paste composition.

17 Claims, 1 Drawing Sheet

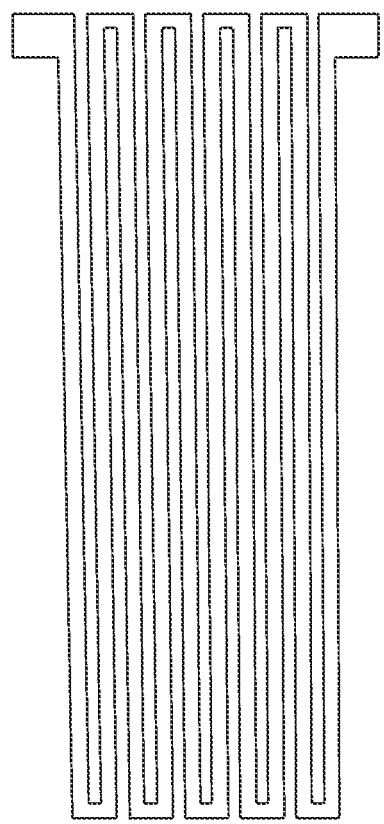

PASTE AND PROCESS FOR FORMING A SOLDERABLE POLYIMIDE-BASED POLYMER THICK FILM CONDUCTOR

FIELD OF THE INVENTION

The invention is directed to a paste composition for forming a solderable polyimide-based polymer thick film (PTF) conductor and a process for forming the conductor utilizing the paste.

TECHNICAL BACKGROUND OF THE INVENTION

Generally, a thick film composition comprises a functional phase that imparts appropriate electrically functional properties to the composition. The functional phase comprises electrically functional powders dispersed in an organic solvent containing a polymer. These compositions will typically contain a binder, e.g., a glass frit. Such a composition is fired to burn out the polymer and solvent and to impart the electrically functional properties. However, in the case of a polymer thick film, the polymer remains as an integral part of the composition after drying and only the solvent is removed. A processing requirement may include a heat treatment such as curing as known to those skilled in the art of polymer thick film technology.

Many PTF compositions are only stable up to approximately 200° C. and therefore do not lend them to soldering as this is done at temperatures of 200 to 260° C. Further, many current PTF electrode compositions do not wet well with solder and do not possess good adhesion to the substrate after soldering.

It is therefore a primary objective of this invention to produce a PTF paste composition which can be used to form a solderable conductor that adheres to the underlying substrate after soldering and a process for forming such a conductor.

SUMMARY OF THE INVENTION

The invention provides a polyimide-based polymer thick film paste composition for forming a solderable polyimide-based polymer thick film conductor, the paste composition comprising:
- (a) 60-95 wt % of an electrically conductive metal powder;
- (b) 2-6 wt % of a polyimide polymer;
- (c) 0.10-0.35 wt % of an organosilicon compound; and
- (d) an organic solvent, wherein the wt % are based on the total weight of the paste composition, the electrically conductive metal powder and the organosilicon compound is dispersed in and the polyimide polymer is dissolved in the organic solvent and the ratio of the weight of the electrically conductive metal powder to the weight of the polyimide polymer is between 13 and 40.

In an embodiment, the polyimide polymer is represented by formula I:

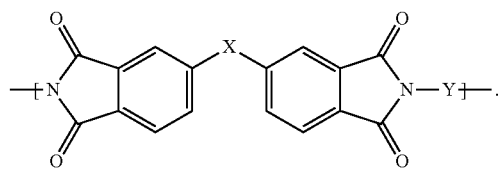

I wherein X is $C(CH_3)_2$, O, $S(O)_2$, $C(CF_3)_2$, O-Ph-$C(CH_3)_2$-Ph-O, O-Ph-O— or a mixture of two or more of $C(CH_3)_2$, O, $S(O)_2$, $C(CF_3)_2$, O-Ph-$C(CH_3)_2$-Ph-O, O-Ph-O—;

wherein Y is a diamine component or a mixture of diamine components selected from the group consisting of: m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4'-(Hexafluoroisopropylidene)bis(2-aminophenol) (6F-AP), bis-(4-(4-aminophenoxy)phenyl)sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)]propane (BAPP), 2,2-bis[4-(4-aminophenoxyphenyl)]hexafluoropropane (HFBAPP), 1,3-bis(3-aminophenoxy)benzene (APB-133), 2,2-bis(3-aminophenyl)hexafluoropropane, 2,2-bis(4 aminophenyl)hexafluoropropane (bis-A-AF), 4,4'-bis(4-amino-2-trifluoromethylphenoxy) biphenyl, 4,4'-[1,3-phenylenebis(1-methyl-ethylidene)], and bisaniline (bisaniline-M) with the proviso that:

i. if X is O, then Y is not m-phenylenediamine (MPD), bis-(4-(4-aminophenoxy)phenyl)sulfone (BAPS) and 3,4'-diaminodiphenyl ether (3,4'-ODA); BAPP, APB-133, or bisaniline-M;

ii. if X is $S(O)_2$, then Y is not 3,3'-diaminodiphenyl sulfone (3,3'-DDS);

iii. if X is $C(CF_3)_2$, then Y is not m-phenylenediamine (MPD), bis-(4-(4-aminophenoxy)phenyl)sulfone (BAPS), 9,9-bis(4-aminophenyl)fluorene (FDA), or 3,3'-diaminodiphenyl sulfone (3,3'-DDS); and iv. if X is O-Ph-$C(CH_3)_2$-Ph-O or O-Ph-O—, then Y is not m-phenylene diamine (MPD), FDA, 3,4'-ODA, DAM, BAPP, APB-133, or bisaniline-M.

The invention also provides an electrical device containing a solderable polyimide-based polymer thick film conductor formed from the paste composition of the invention.

The invention further provides a process for forming a solderable polyimide-based polymer thick film conductor using the instant paste composition, comprising the steps of:
(i) providing a substrate;
(ii) preparing a paste composition comprising:
- (a) 60-95 wt % of an electrically conductive metal powder;
- (b) 2-6 wt % of a polyimide polymer;
- (c) 0.10-0.35 wt % of an organosilicon compound; and
- (d) an organic solvent, wherein the wt % are based on the total weight of the paste composition, the electrically conductive metal powder and the organosilicon compound is dispersed in and the polyimide polymer is dissolved in the organic solvent and the ratio of the weight of the electrically conductive metal powder to the weight of the polyimide polymer is between 13 and 40.

(iii) applying the paste composition in the desired pattern onto the substrate; and
(iv) curing the paste composition applied in step (iii) by heating at a temperature of 320 to 380° C. for at least 30 minutes.

In one embodiment the paste composition is fired at temperatures of from 320 to 380° C. for at least 30 minutes. In another embodiment, the paste composition is fired at temperatures of from 320 to 380° C. for at least 1 hour. In still another embodiment the paste composition is fired at temperatures of from 330 to 380° C. for at least 1 hour and in other embodiments for 5 hours.

In one embodiment after step (iii) but before step (iv) the paste composition applied in step (iii) is dried by heating at a temperature sufficient to remove the organic solvent.

The invention also provides an electrical device containing a solderable polyimide-based polymer thick film conductor formed using the process of the invention.

BRIEF DESCRIPTION OF THE FIGURE

The FIGURE illustrates the serpentine screen printed paste pattern used in the Comparative Experiment and the Examples.

DETAILED DESCRIPTION OF INVENTION

The invention relates to a paste composition for forming a solderable polyimide-based polymer thick film (PTF) conductor and a process for forming the conductor utilizing the paste. The paste is typically used In an electrical device to form an electrical conductor that is solderable has good adhesion and thereby provides for electrical connections.

The main components of the instant polyimide-based polymer thick film paste composition are an electrically conductive metal powder, a polyimide polymer, an organosilicon compound and an organic solvent, A. Electrically Conductive Metal The electrically conductive metal powder in the present polymer thick film composition is a powder of electrically conductive metal particles.

In one embodiment the electrically conductive metal is selected from the group consisting of Ag, Cu, Au, Pd, Pt, Sn, Al, Ni and mixtures thereof In an embodiment, the conductive particles may include silver (Ag). In a further embodiment, the conductive particles may, for example, include one or more of the following: Ag, Cu, Au, Pd, Pt, Sn, Al, Ni, Ag—Pd and Pt—Au. In another embodiment, the conductive particles may include one or more of the following: (1) Al, Cu, Au, Ag, Pd and Pt; (2) an alloy of Al, Cu, Au, Ag, Pd and Pt; and (3) mixtures thereof. In still another embodiment, the conductive particles may include one of the above mentioned metals coated with another of the metals, e.g., Ag-coated Cu, Ag-coated-Ni. An embodiment may contain a mixture of any of the above.

When the metal is silver, it can be in the form of silver metal, alloys of silver or mixtures thereof. The silver can also be in the form of silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$) or mixtures thereof. Other forms of silver compatible with the other thick-film paste components can also be used.

The source of the electrically conductive metal can be in a flake form, a spherical form, a granular form, a crystalline form, other irregular forms and mixtures thereof.

To attain high conductivity in a finished conductive structure, it is generally preferable to have the concentration of the electrically conductive metal be as high as possible while maintaining other required characteristics of the paste composition that relate to either processing or final use.

In one embodiment, the electrically conductive metal is from about 60 to about 95 wt % of the polymer thick film paste composition. In a further embodiment, the source of the electrically conductive metal is from about 75 to about 90 wt % of the solid components of the thick film paste composition.

In one embodiment, the electrically conductive metal is silver and the silver is from about 60 to about 95 wt % of the polymer thick film paste composition. In another embodiment, the silver is from about 75 to about 90 wt % of the solid components of the thick film paste composition. As used herein, weight percent is written as wt %.

The particle size of the electrically conductive metal is not subject to any particular limitation. In an embodiment, the average particle size may be less than 10 microns, and, in a further embodiment, no more than 5 microns. In an aspect, the average particle size may be 0.1 to 5 microns, for example. As used herein, "particle size" is intended to mean "average particle size"; "average particle size" means the 50% volume distribution size. The 50% volume distribution size can be denoted as $D_{50}$. Volume distribution size may be determined by a number of methods understood by one of skill in the art, including but not limited to laser diffraction and dispersion method using a Microtrac particle size analyzer (Montgomeryville, Pa.). Laser light scattering, e.g., using a model LA-910 particle size analyzer available commercially from Horiba Instruments Inc. (Irvine, Calif.), may also be employed.

B. Polyimide Polymer

A polyimide polymer that can withstand temperatures up to 320° C. can be used in the paste composition used in the instant process.

In an embodiment, the polyimide polymer is represented by formula I:

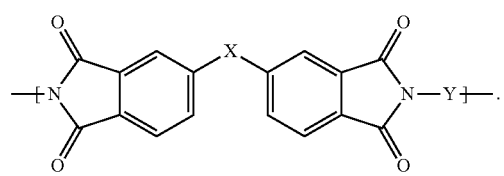

wherein X is $C(CH_3)_2$, O, $S(O)_2$, $C(CF_3)_2$, O-Ph-$C(CH_3)_2$-Ph-O, O-Ph-O— or a mixture of two or more of $C(CH_3)_2$, O, $S(O)_2$, $C(CF_3)_2$, O-Ph-$C(CH_3)_2$-Ph-O, O-Ph-O—;

wherein Y is a diamine component or a mixture of diamine components selected from the group consisting of: m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4'-(Hexafluoroisopropylidene)bis(2-aminophenol) (6F-AP), bis-(4-(4-aminophenoxy)phenyl)sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)]propane (BAPP), 2,2-bis[4-(4-aminophenoxyphenyl)] hexafluoropropane (HFBAPP), 1,3-bis(3-aminophenoxy) benzene (APB-133), 2,2-bis(3-aminophenyl) hexafluoropropane, 2,2-bis(4 aminophenyl) hexafluoropropane (bis-A-AF), 4,4'-bis(4-amino-2-trifluoromethylphenoxy) biphenyl, 4,4'-[1,3-phenylenebis (1-methyl-ethylidene)], and bisaniline (bisaniline-M) with the proviso that:

i. if X is O, then Y is not m-phenylenediamine (MPD), bis-(4-(4-aminophenoxy)phenyl)sulfone (BAPS) and 3,4'-diaminodiphenyl ether (3,4'-ODA); BAPP, APB-133, or bisaniline-M;

ii. if X is $S(O)_2$, then Y is not 3,3'-diaminodiphenyl sulfone (3,3'-DDS);

iii. if X is $C(CF_3)_2$, then Y is not m-phenylenediamine (MPD), bis-(4-(4-aminophenoxy)phenyl)sulfone (BAPS), 9,9-bis(4-aminophenyl)fluorene (FDA), or 3,3'-diaminodiphenyl sulfone (3,3'-DDS); and iv. if X is O-Ph-C(CH$_3$)$_2$-Ph-O or O-Ph-O—, then Y is not m-phenylene diamine (MPD), FDA, 3,4'-ODA, DAM, BAPP, APB-133, or bisaniline-M.

In one embodiment the polyimide can be prepared in the dry and powdered state by reacting monomers 2,2'-Bis (trifluoromethyl)-4,4'-diamino biphenyl (TFMB), 2,2Bis(3-amino-4-hydroxyphenyl)hexafluoropropane (6F-AP) and Hexafluoroisopropylidenebis-phthalic dianhydride. (6-FDA). in a ratio of 33/10/57 (TFMB/6F-AP/6-FDA) through the well-known process of first making polyamic acid in N,N-Dimethylacetamide (DMAC) solvent, controlling the molecular weight of said polyamic acid with end-capping additives, then chemically imidizing and precipitating the polyimide polymer using methanol neat additions to the DMAC solution. The precipitate was washed several times with methanol neat, filtered and then dried at approximately 200° C. to form a dry and handleable powder and to reduce DMAC residuals to below 0.1% weight. The resulting powder can be dried and stored at room temperature or dissolved in a solvent in preparation for forming the paste composition.

In one embodiment, the polyimide polymer is from about 2 to about 6 wt % of the polymer thick film paste composition.

In one embodiment, the ratio of the weight of the electrically conductive metal powder to the weight of the polyimide polymer is between 13 and 40.

C. Organosilicon Compound

The presence of 0.1-0.35 wt % organosilicon compound is critical to curing the paste at temperatures of 320 to 380° C. and producing solderable thick film conductors that exhibit good adhesion. In one embodiment the organosilicon compound is a siloxane, e.g. polydimethylsiloxane (PDMS). In another embodiment, the organosilicon compound is a silsesquioxane, [R—SiO$_{3/2}$]$_n$ where R=H, alkyl or alkoxyl or an alkoxysilane, i.e., a silicon esther, R$_x$Si(OR")$_{4-x}$, where R and R" are alkyl groups and x=1-3.

D. Organic Solvent

The electrically conductive metal powder is dispersed in and the polyimide polymer is dissolved in the organic solvent. The electrically conductive metal powder is dispersed by mechanical mixing to form a paste like composition having suitable consistency and rheology for printing.

The solvent must be one which can dissolve the polyimide polymer and in which the electrically conductive metal powder is dispersible with an adequate degree of stability. The organic solvent is one that can be boiled off at relatively low temperature. The rheological properties of the solvent must be such that they lend good application properties to the composition. Such properties include dispersion of the electrically conductive metal powder with an adequate degree of stability, good application of composition, appropriate viscosity, thixotropy, appropriate wettability of the substrate and the electrically conductive metal powder and a good drying rate.

Solvents suitable for use in the polyimide-based polymer thick film paste composition are acetates and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In embodiments of the present invention, solvents such as glycol ethers, ketones, esters and other solvents of like boiling points (in the range of 180° C. to 250° C.), and mixtures thereof may be used. In one embodiment, the solvent is one or more components selected from the group consisting butyl carbitol acetate, dibasic acetates, diethyl adipate and triethylphosphate. Various combinations of these and other solvents are formulated to obtain the viscosity and volatility requirements desired. In addition, volatile liquids for promoting rapid hardening after application on the substrate may be included in the organic vehicle.

Although screen-printing is expected to be a common method for the deposition of polymer thick film conductive compositions, other conventional methods including stencil printing, syringe dispensing or other deposition or coating techniques may be utilized.

In one embodiment, the organic solvent is present up to 25 wt % of the total weight of the paste composition.

Application of Polymer Thick Films

The polymer thick film paste composition is deposited on a substrate typical of those used in electric devices. In a typical embodiment, the substrate is impermeable to gases and moisture. The substrate can be a sheet of flexible material. The flexible material can be an impermeable material such as a polyimide film, e.g. Kapton®. The material can also be a polyester, e.g. polyethylene terephthalate, or a composite material made up of a combination of plastic sheet with optional metallic or dielectric layers deposited thereupon.

The deposition of the polymer thick film conductive composition is performed preferably by screen printing, although other deposition techniques such as stencil printing, syringe dispensing or coating techniques can be utilized. In the case of screen-printing, the screen mesh size controls the thickness of deposited thick film.

The deposited thick film conductive composition is dried, i.e., the solvent is evaporated, by exposure to heat, e.g. at 130° C. for minutes. The paste is then cured by heating at a temperature of 320 to 380° C. for at least 30 minutes to form the solderable polyimide-based polymer thick film conductor. In another embodiment the paste is cured by heating at a temperature of 330 to 380° C. for at least 1 hour. In another embodiment, the paste is cured by heating at a temperature of 330 to 380° C. for at least 1 hour.

EXAMPLES

The substrates used in the Examples were Kapton® 500HPP-ST and Kapton® 200RS100 films (obtained from the DuPont Co, Wilmington, Del.) and used as received after cut into 2.5"×3.5" pieces and alumina (AD-96) substrates (obtained from CoorsTek, Golden, Colo.) used with no further cleaning.

The polyimide polymer used in the Comparative Experiments and the Examples was prepared as described above by reacting TFMB, 6F-AP and 6-FDA. in a ratio of 33/10/57.

A silicone oil purchased from Aldrich (product #146153) was used as a source of polydimethylsiloxne (PDMS).

Adhesion was measured by a Scotch® Tape test in which the tape was applied to the cured sample and then pulled off. The adhesion was judged on a scale of from poor (>10% peeling) to good (<1% peeling).

The SAC alloy with a composition of Sn96.5% Ag3.0% Cu0.5% was used for the solder wetting test. Either Alpha 611 or Kester 952 flux was used. In the solder wetting test the cured samples were typically dipped for 1-3 seconds into the SAC alloy pot that was kept at 225-250° C.

Comparative Experiment A

A screen printable Ag composition was prepared using silver flakes having an average particle size of 3-4 micron. The components of the PTF silver conductor composition were:

| | |
|---|---|
| 84 wt % | silver powder |
| 3.4 wt % | polyimide |
| 5.3 wt % | butylcarbitol acetate |
| 2 wt % | dibasic acetates (DBE-3) |
| 5.3 wt % | diethyl adipate | wherein the wt % are based on the total weight of the composition. This composition contained no organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 325 mesh stainless steel screen, several patterns were printed, and the silver paste was dried at 130° C. for 10 min. The measured line resistance from the samples was 7.7Ω. The average conductor thickness over the 600 square pattern was determined to be 12.7 μm using a profilometer. Therefore the resistivity was calculated to be 6.5 mΩ/□/mil. Some of the samples cured at 130° C. for 10 min were cured further for 1 h at 300° C. to give an average resistivity of 1.8 mΩ/□/mil.

Solder wettability was tested in the manner described above using the parts cured at 130° C./300° C. The samples showed near 100% solder wetting, and adhesion found to be good. However, the samples cured at 130° C. for 10 min were also cured further at 360° C. for 5 h and showed a cohesive failure in adhesion.

Comparative Experiment B

A screen printable Ag composition was prepared using silver flakes having an average particle size of 3-4 micron. The components of the PTF silver conductor composition were:

| | |
|---|---|
| 79.7 wt % | silver powder |
| 4 wt % | polyimide |
| 16.1 wt % | triethylphosphate |
| 0.2 wt % | oleic acid | wherein the wt % are based on the total weight of the composition. This composition contained no organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 325 mesh stainless steel screen, several patterns were printed, and the silver paste was dried at 130° C. for 10 min. The measured line resistance from the samples was 6.7Ω. The average conductor thickness over the 600 square pattern was determined to be 13.8 μm using a profilometer. Therefore the resistivity was calculated to be 6.1 mΩ/□/mil. Some of the samples were cured further for 1 h at 300° C. to give an average resistivity of 1.9 mΩ/□/mil.

Solder wettability was tested in the manner described above using the parts cured at 130° C./300° C. The samples showed near 100% solder wetting, and adhesion found to be good. However, the samples cured at 130° C. for 10 min were also cured further at 360° C. for 5 h and showed a cohesive failure in adhesion.

Comparative Experiment C

A screen printable Ag composition was prepared using silver flakes having an average particle size of 3-4 micron. The components of the PTF silver conductor composition were:

| | |
|---|---|
| 85.4 wt % | silver powder |
| 2.6 wt % | polyimide |
| 11.5 wt % | triethylphosphate |
| 0.5 wt % | silicon oil (PDMS) | wherein the wt % are based on the total weight of the composition. This composition contained 0.5 wt % organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 200 mesh stainless steel screen, several patterns were printed, and the silver paste was dried at 130° C. for 10 min, and then 300° C. for 1 h. The average resistivity of 7.6 mΩ/□/mil was obtained. Solder wettability was tested in the manner described above using the samples. The samples showed less than 80% solder wetting, but no adhesion failure was observed.

Some printed samples were also cured at 130° C. for 10 min, and then cured further at 360° C. for 5 h. Severe adhesive failure was observed and near 100% peeling was observed by the tape peel test.

Comparative Experiment D

A screen printable Ag composition was prepared using silver flakes having an average particle size of 3-4 micron. The components of the PTF silver conductor composition were:

| | |
|---|---|
| 83.85 wt % | silver powder |
| 3.4 wt % | polyimide |
| 5.3 wt % | butylcarbitol acetate |
| 2.1 wt % | dibasic acetates (DBE-3) |
| 5.3 wt % | diethyl adipate |
| 0.05 wt % | silicon oil | wherein the wt % are based on the total weight of the composition. This composition contained 0.05 wt % organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 325 mesh stainless steel screen, several patterns were printed, and the silver paste was dried at 130° C. for 10 min and then at 200° C. for 30 min. The measured line resistance from the samples was 4.53Ω. The average conductor thickness over the 600 square pattern was determined to be 8.97 μm using a profilometer. Therefore the resistivity was calculated to be 2.7 mΩ/□/mil.

Some samples were cured further at 360° C. for 5 h to give an average resistivity of 1.2 mΩ/□/mil. However, adhesion was tested for the samples and was found to be poor.

Comparative Experiment E

A screen printable Ag composition was prepared using silver flakes having an average particle size of 3-4 micron. The components of the PTF silver conductor composition were:

| | |
|---|---|
| 83.6 wt % | silver powder |
| 3.4 wt % | polyimide |
| 5.3 wt % | butylcarbitol acetate |
| 2 wt % | dibasic acetates (DBE-3) |
| 5.3 wt % | diethyl adipate |
| 0.4 wt % | silicon oil (PDMS) | wherein the wt % are based on the total weight of the composition. This composition contained 0.4 wt % organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 325 mesh stainless steel screen, several patterns were printed, and the silver paste was dried at 130° C. for 10 min, and then at 200° C. for 30 min. The measured line resistance from the samples was 4.62Ω. The samples were cured further for 5 h at 360° C. to give an average resistance of 3.43Ω. The average conductor thickness over the 600 square pattern was determined to be 12.99 μm using a profilometer. Therefore the resistivity was calculated to be 3.0 mΩ/□/mil. Some of the samples were cured further for 5 h at 360° C., however, adhesive failure was observed from some of the samples as cured. The tape peel test gave near 100% adhesive failure.

Example 1

A screen printable Ag composition was prepared using silver flakes having an average particle size of 3-4 micron. The components of the PTF silver conductor composition were:

| | |
|---|---|
| 83.4 wt % | silver powder |
| 3.4 wt % | polyimide |
| 5.3 wt % | butylcarbitol acetate |
| 2.2 wt % | dibasic acetates (DBE-3) |
| 5.4 wt % | diethyl adipate |
| 0.2 wt % | silicon oil | wherein the wt % are based on the total weight of the composition. The ratio of the weight of the silver powder to the weight of the polyimide polymer was 24.5. This composition contained 0.2 wt % organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 200 mesh stainless steel screen, several patterns were printed, and the silver paste was dried at 130° C. for 10 min and then cured at 300° C. for 1 h, which gave resistivity of 4.4 mΩ/□/mil.

Solder wettability was also tested in the manner described above using the parts cured at 130° C./300° C. The samples showed 100% solder wetting. Adhesion was tested for the samples and was found to be good.

Some of the printed samples were also cured at 130° C. for 10 min, and then additionally for 5 h at 360° C. to give an average resistivity of 3.2 mΩ/□/mil. No adhesion failure was observed. The samples showed near 100% solder wetting.

Example 2

A screen printable Ag composition was prepared using silver flakes having an average particle size of 3-4 micron. The components of the PTF silver conductor composition were:

| | |
|---|---|
| 79.1 wt % | silver powder |
| 4 wt % | polyimide |
| 16.5 wt % | triethylphosphate |
| 0.2 wt % | oleic acid |
| 0.2 wt % | silicon oil (PDMS) | wherein the wt % are based on the total weight of the composition. The ratio of the weight of the silver powder to the weight of the polyimide polymer was 19.8. This composition contained 0.2 wt % organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 200 mesh stainless steel screen, several patterns were printed, and the silver paste was cured at 130° C. for 10 min, and then 300° C. for 1 h to give an average resistivity of 3.9 mΩ/□/mil. Solder wettability was tested in the manner described above using the samples. The samples showed near 100% solder wetting. Adhesion was tested for the samples and was found to be good.

Some of the samples were at 130° C. for 10 min, and then cured further for 5 h at 360° C. to give an average resistivity of 2.6 mΩ/□/mil. No adhesion failure was observed. The samples showed near 100% solder wetting.

Example 3

A screen printable Ag composition was prepared using silver flakes having an average particle size of 3-4 micron. The components of the PTF silver conductor composition were:

| | |
|---|---|
| 85.7 wt % | silver powder |
| 2.6 wt % | polyimide |
| 11.4 wt % | triethylphosphate |
| 0.3 wt % | silicon oil (PDMS) | wherein the wt % are based on the total weight of the composition. The ratio of the weight of the silver powder to the weight of the polyimide polymer was 33. This composition contained 0.3 wt % organosilicon compound.

The components were combined and mixed for 30-60 seconds in a Thinky-type mixer, and then roll-milled. The composition was used to screen print a 600 square serpentine pattern (shown in the FIGURE) on Kapton® 500HPP-ST. Using a 325 mesh stainless steel screen, several patterns were printed, and the silver paste was cured at 130° C. for 10 min, and then 300° C. for 1 h to give an average resistivity of 5.3 mΩ/□/mil. Solder wettability was tested in the manner described above using the samples. The samples showed nearly 100% solder wetting. No adhesion failure was observed by the tape peel test.

Some printed samples were also cured at 130° C. for 10 min, and then cured further at 360° C. for 5 h, which gave an average resistivity of 4.6 mΩ/□/mil. The samples showed 100% solder wetting and no adhesion failure was observed for the samples.

What is claimed is:

1. A polyimide-based polymer thick film paste composition for forming a solderable polyimide-based polymer thick film conductor, the paste composition comprising:
   (a) 60-95 wt % of an electrically conductive metal powder;
   (b) 2-6 wt % of a polyimide polymer;
   (c) 0.10-0.35 wt % of an organosilicon compound and
   (d) an organic solvent,
wherein the wt % are based on the total weight of the paste composition, and wherein the electrically conductive metal powder and the organosilicon compound are dispersed in the organic solvent, and the polyimide polymer is dissolved in the organic solvent and the ratio of the weight of the electrically conductive metal powder to the weight of the polyimide polymer is between 13 and 40.

2. The polyimide-based polymer thick film paste composition of claim 1, said paste composition comprising: 75-90 wt % of an electrically conductive metal powder.

3. The polyimide-based polymer thick film paste composition of claim 1, wherein said electrically conductive metal is selected from the group consisting of Ag, Cu, Au, Pd, Pt, Sn, Al, Ni, alloys of Ag, Cu, Au, Pd, Pt, Sn, Al, Ni, one of Ag, Cu, Au, Pd, Pt, Sn, Al, Ni coated with one of Ag, Cu, Au, Pd, Pt, Sn, Al, Ni and mixtures thereof.

4. The polyimide-based polymer thick film paste composition of claim 1, wherein said electrically conductive metal is selected from the group consisting of Ag, Ag-coated Cu, Ag-coated-Ni and mixtures thereof.

5. The polyimide-based polymer thick film paste composition of claim 1, wherein said polyimide polymer is represented by formula I:

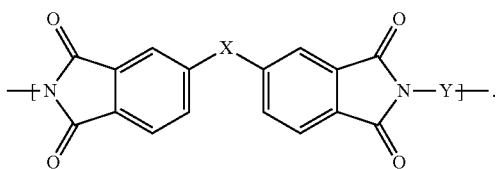

wherein X is C(CH$_3$)$_2$, O, S(O)$_2$, C(CF$_3$)$_2$, O-Ph-C(CH$_3$)$_2$- Ph-O, O-Ph-O— or a mixture of two or more of C(CH$_3$)$_2$, O, S(O)$_2$, C(CF$_3$)$_2$, O-Ph-C(CH$_3$)$_2$-Ph-O, O-Ph-O—;

wherein Y is a diamine component or a mixture of diamine components selected from the group consisting of: m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4'-(Hexafluoroisopropylidene)bis(2-aminophenol) (6F-AP), bis-(4-(4-aminophenoxy)phenyl)sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)]propane (BAPP), 2,2-bis[4-(4-aminophenoxyphenyl)]hexafluoropropane (HFBAPP), 1,3-bis(3-aminophenoxy)benzene (APB-133), 2,2-bis(3-aminophenyl)hexafluoropropane, 2,2-bis(4 aminophenyl)hexafluoropropane (bis-A-AF), 4,4'-bis(4-amino-2-trifluoromethylphenoxy) biphenyl, 4,4'[1,3-phenylenebis(1-methyl-ethylidene)], and bisaniline (bisaniline-M) with the proviso that:
   i. if X is O, then Y is not m-phenylenediamine (MPD), bis-(4-(4-aminophenoxy)phenyl)sulfone (BAPS) and 3,4'-diaminodiphenyl ether (3,4'-ODA); BAPP, APB-133, or bisaniline-M;
   ii. if X is S(O)$_2$, then Y is not 3,3'-diaminodiphenyl sulfone (3,3'-DDS);
   iii. if X is C(CF$_3$)$_2$, then Y is not m-phenylenediamine (MPD), bis-(4-(4-aminophenoxy)phenyl)sulfone (BAPS), 9,9-bis(4-aminophenyl)fluorene (FDA), or 3,3'-diaminodiphenyl sulfone (3,3'-DDS); and
   iv. if X is O-Ph-C(CH$_3$)$_2$-Ph-O or O-Ph-O—, then Y is not m-phenylene diamine (MPD), FDA, 3,4'-ODA, DAM, BAPP, APB-133, or bisaniline-M.

6. The polyimide-based polymer thick film paste composition of claim 1, wherein said organosilicon compound is polydimethylsiloxane.

7. The polyimide-based polymer thick film paste composition of claim 1, wherein said organosilicon compound is a silsesquioxane or an alkoxysilane.

8. An electrical device containing a solderable polyimide-based polymer thick film conductor formed from the polyimide-based polymer thick film paste composition of claim 1.

9. The electrical device of claim 8, wherein said organosilicon compound is polydimethylsiloxane.

10. The electrical device of claim 8, wherein said organosilicon compound is a silsesquioxane or an alkoxysilane.

11. A process for forming a solderable polyimide-based polymer thick film conductor, comprising the steps of:
   (i) providing a substrate;
   (ii) preparing a paste composition comprising:
      (a) 60-95 wt % of an electrically conductive metal powder;
      (b) 4-6 wt % of a polyimide polymer;
      (c) 0.10-0.35 wt % of a organosilicon compound; and
      (d) an organic solvent,
      wherein the wt % are based on the total weight of the paste composition, and wherein the electrically conductive metal powder and the organosilicon compound are dispersed in the organic solvent, and the polyimide polymer is dissolved in the organic solvent and the ratio of the weight of the electrically conductive metal powder to the weight of the polyimide polymer is between 13 and 40,
   (iii) applying said paste composition in the desired pattern onto said substrate; and
   (iv) curing said paste composition applied in step (iii) by heating at a temperature of 320 to 380° C. for at least 30 minutes to form said solderable polyimide-based polymer thick film conductor.

12. The process of claim 11, wherein after step (iii) but before step (iv) said paste composition applied in step (iii) is dried by heating at a temperature sufficient to remove said organic solvent.

13. The process of claim 12, wherein said paste composition is cured by heating at a temperature of 330 to 380° C. for at least 1 h to form said solderable polyimide-based polymer thick film conductor.

14. The process of claim 11, wherein said polyimide polymer is represented by formula I:

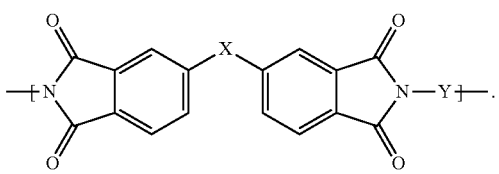

wherein X is C(CH$_3$)$_2$, O, S(O)$_2$, C(CF$_3$)$_2$, O-Ph-C(CH$_3$)$_2$-Ph-O, O-Ph-O— or a mixture of two or more of C(CH$_3$)$_2$, O, S(O)$_2$, C(CF$_3$)$_2$, O-Ph-C(CH$_3$)$_2$-Ph-O, O-Ph-O—;

wherein Y is a diamine component or a mixture of diamine components selected from the group consisting of: m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4'-(Hexafluoroisopropylidene)bis(2-aminophenol) (6F-AP), bis-(4-(4-aminophenoxy)phenyl)sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)]propane (BAPP), 2,2-bis[4-(4-aminophenoxyphenyl)]hexafluoropropane (HFBAPP), 1,3-bis(3-aminophenoxy) benzene (APB-133), 2,2-bis(3-aminophenyl)hexafluoropropane, 2,2-bis(4 aminophenyl)hexafluoropropane (bis-A-AF), 4,4'-bis(4-amino-2-trifluoromethylphenoxy) biphenyl, 4,4'[1,3-phenylenebis(1-methyl-ethylidene)], and bisaniline (bisaniline-M) with the proviso that:

i. if X is O, then Y is not m-phenylenediamine (MPD), bis-(4-(4-aminophenoxy)phenyl)sulfone (BAPS) and 3,4'-diaminodiphenyl ether (3,4'-ODA); BAPP, APB-133, or bisaniline-M;

ii. if X is S(O)$_2$, then Y is not 3,3'-diaminodiphenyl sulfone (3,3'-DDS);

iii. if X is C(CF$_3$)$_2$, then Y is not m-phenylenediamine (MPD), bis-(4-(4-aminophenoxy)phenyl)sulfone (BAPS), 9,9-bis(4-aminophenyl)fluorene (FDA), or 3,3'-diaminodiphenyl sulfone (3,3'-DDS); and iv. if X is O-Ph-C(CH$_3$)$_2$-Ph-O or O-Ph-O—, then Y is not m-phenylene diamine (MPD), FDA, 3,4'-ODA, DAM, BAPP, APB-133, or bisaniline-M.

15. The process of claim 11, wherein the substrate is a polyimide, alumina or aluminum.

16. The process of claim 11, wherein said paste composition is cured by heating at a temperature of 330 to 380° C. for at least 1 hour to form said solderable polyimide-based polymer thick film conductor.

17. An electrical device containing a solderable polyimide-based polymer thick film conductor formed using the process of claim 11.

* * * * *